(12) United States Patent
Adams

(10) Patent No.: US 8,330,040 B2
(45) Date of Patent: Dec. 11, 2012

(54) PHOTOVOLTAIC CELLS INCLUDING SPACED RAMPS AND METHODS OF MANUFACTURE

(75) Inventor: Bruce E. Adams, Portland, OR (US)

(73) Assignee: Applied Materials, Inc., Santa Clara, CA (US)

( * ) Notice: Subject to any disclaimer, the term of this patent is extended or adjusted under 35 U.S.C. 154(b) by 333 days.

(21) Appl. No.: 12/628,451

(22) Filed: Dec. 1, 2009

(65) Prior Publication Data

US 2010/0193020 A1 Aug. 5, 2010

Related U.S. Application Data

(60) Provisional application No. 61/119,426, filed on Dec. 3, 2008.

(51) Int. Cl.
H01L 31/00 (2006.01)
(52) U.S. Cl. .......................... 136/258; 136/261; 136/256
(58) Field of Classification Search .................. 136/252, 136/258, 256, 261
See application file for complete search history.

(56) References Cited

U.S. PATENT DOCUMENTS

| | | | |
|---|---|---|---|
| 5,922,142 A * | 7/1999 | Wu et al. ........................ | 136/260 |
| 6,524,880 B2 | 2/2003 | Moon et al. | |
| 6,632,116 B2 | 10/2003 | Watanabe et al. | |
| 2005/0000561 A1* | 1/2005 | Baret et al. ..................... | 136/244 |
| 2007/0131271 A1* | 6/2007 | Lim et al. ....................... | 136/244 |
| 2008/0289681 A1 | 11/2008 | Adriani et al. | |
| 2009/0194163 A1 | 8/2009 | Sivaram et al. | |
| 2010/0065104 A1 | 3/2010 | Baruh | |
| 2011/0023957 A1* | 2/2011 | Eberspacher et al. ........ | 136/256 |

FOREIGN PATENT DOCUMENTS

| | | |
|---|---|---|
| JP | 2007-017601 A | 1/2007 |
| JP | 2007-307539 A | 11/2007 |
| KR | 10-0785730 B1 | 12/2007 |

OTHER PUBLICATIONS

PCT ISR & Wo in PCT/US2011/038853, mailed Dec. 7, 2011, 8 pgs.
"PCT Search Report", PCT/US2009/066395, Jul. 6, 2010, 3 pgs.
"PCT Written Opinion", PCT/US2009/066395, Jul. 6, 2010, 3 pgs.
Dunsky, Corey M., et al., "Scribing thin-film solar panels", http://www.industrial-lasers.com/articles/print, (Feb. 2008), 3 pgs.

* cited by examiner

*Primary Examiner* — Basia Ridley
*Assistant Examiner* — Alexander Kollias
(74) *Attorney, Agent, or Firm* — Diehl Servilla LLC

(57) ABSTRACT

Photovoltaic cells and methods for the manufacture of photovoltaic cells are described. Operative layers of the photovoltaic cell are deposited onto a superstrate having a plurality of spaced ramps, allowing for the individual cells to be connected in series with minimal loss of the efficiency due to dead space between the cells.

10 Claims, 4 Drawing Sheets

PHOTOVOLTAIC CELLS INCLUDING SPACED RAMPS AND METHODS OF MANUFACTURE

CROSS-REFERENCE TO RELATED APPLICATION

This application claims priority to U.S. Provisional Application No. 61/119,426, filed Dec. 3, 2008, which is hereby incorporated by reference in its entirety.

BACKGROUND

Embodiments of the present invention generally relate to photovoltaic cells and methods for making photovoltaic cells. Specific embodiments pertain to photovoltaic cells and methods of making photovoltaic cells having a substantially minimized dead zone.

A typical manufacturing process for solar cells is shown in FIG. 1. Starting at 100, solar cells are manufactured by starting with a glass sheet or substrate 114. An exemplary thickness for the glass sheet is about 3 mm. In the art, this glass substrate is typically called a glass superstrate because sunlight will enter through this support glass. During the manufacture of a solar cell, shown in step 102, a continuous, uniform layer of a transparent conductive oxide (TCO) 116 is deposited on the glass substrate 114. The thickness of the TCO layer 116 is typically a few hundred nanometers. The TCO layer 116 eventually forms the front electrodes of the solar cell. Suitable materials for the TCO layer 116 include, but are not limited to, aluminum-doped zinc oxide (AZO), indium tin oxide (ITO), indium molybdenum oxide (IMO), indium zinc oxide (IZO) and tantalum oxide. The TCO layer 116 can be deposited by any suitable process, such as chemical vapor deposition (CVD).

In step 104, after the deposition of the TCO layer 116, a laser scribing process, which is often referred to as P1, scribes strips 118 through the entire thickness of the TCO layer 116. The scribed strips are usually 5-10 mm apart. After the scribing process P1, a p- and n-type silicon layer 120 is deposited over the TCO layer 116, as shown in step 106. The total thickness of the silicon layer 120 is typically on the order of 2-3 μm, and this layer is usually deposited by chemical vapor deposition or other suitable processes.

Referring to step 108, the silicon deposition step is followed by a second laser scribing step, often referred to as P2, which completely cuts strips 122 through the silicon layer 120. As shown in step 110, a metal layer 124 that forms the rear electrode is deposited over the silicon layer 120. The metal layer 124 can be deposited by any suitable deposition process, such as physical vapor deposition (PVD). Referring now to step 112, a third scribing process, called P3, is used to scribe strips 126 through the metal layer 124 and the silicon layer 120. The panel is then typically sealed with a rear surface glass lamination (not shown). The area between, and including, the P1 and P3 scribes results in a dead zone 128 which decreases the overall efficiency of the cell. The dead zone is typically in the range of about 100 μm to about 500 μm, depending on the accuracy of the lasers and optics employed in the scribing processes.

Therefore, there is a need to provide methods to improve the efficiency of photovoltaic cells.

SUMMARY OF THE INVENTION

One embodiment of the present invention relates to a method of making a photovoltaic cell comprising providing a superstrate having a front side and a back side, the back side having a plurality of spaced ramps thereon, the spaced ramps including ramped surfaces and vertical faces which are substantially perpendicular to the back side of the superstrate; depositing a transparent conductive oxide layer onto the back side of the superstrate such that substantially none of the transparent conductive oxide coats the vertical faces of the spaced ramps; depositing a silicon layer on the transparent conductive oxide layer such that the silicon layer deposited on the vertical faces of the spaced ramps does not contact the transparent conductive oxide layer on top on the ramped surfaces of the spaced ramps; depositing a metal layer on the silicon layer, resulting in a plurality of peaks extending from the ramped surfaces through the metal layer; and removing at least a portion of the peaks extending through the metal layer to achieve a substantially flat surface extending across the superstrate, to produce a photovoltaic cell.

In one embodiment, a method further comprises applying a polymer lamination layer to the flattened metal layer followed by a layer of glass.

In one embodiment, the spaced ramps are separated so that there is a region of flat superstrate between each spaced ramp. In one embodiment, the transparent conductive oxide layer is deposited by physical vapor deposition. In one embodiment, the transparent conductive oxide layer is deposited on an angle such that the vertical faces of the spaced ramps are shielded by the ramped surfaces.

According to an embodiment, the silicon layer is deposited by chemical vapor deposition. In an embodiment, the peaks in the metal layer are flattened by one or more process including buffing, grinding and cutting.

In one embodiment, a method further comprises cleaning the vertical face of the spaced ramps after deposition of the transparent conductive oxide layer by laser ablation performed at a grazing angle to hit substantially only the vertical surfaces. According to an embodiment, the superstrate is glass or plastic, and the spaced ramps are formed on the superstrate by one or more of intaglio, rotogravure, etching, engraving, relief printing and lithography.

Another aspect of the invention pertains to a photovoltaic cell comprising a superstrate having a front side and a back side, the back side having a plurality of spaced ramps including ramped surfaces and vertical faces which are substantially perpendicular to the back side of the superstrate; a layer of a transparent conductive oxide on the back side of the superstrate; a layer of amorphous silicon overlying the transparent conductive oxide layer; and a layer of metal overlying the silicon layer, the metal layer having a front side facing the silicon layer and a back side. In one embodiment, the spaced ramps extend from the superstrate through at least a portion of the layers and the metal layer is smoothed resulting in a substantially flat back surface and exposing portions of the silicon layer.

In one embodiment, silicon layer does not extend above the vertical side of the spaced ramps. In one embodiment, the photovoltaic cell further comprises a polymer laminate on the metal layer and glass on the polymer laminate layer. In an embodiment, the separation between the spaced ramps is in the range of about 5 mm to about 10 mm. According to an embodiment, the spaced ramps extend outwardly from the back side of the superstrate up to a height of about 5 microns.

In an embodiment, the superstrate is about 3 mm thick. The superstrate may comprise glass or plastic, according to one or more embodiments. In one embodiment, the photovoltaic cell has a dead zone smaller than about 100 microns.

The foregoing has outlined rather broadly certain features and technical advantages of the present invention. It should be appreciated by those skilled in the art that the specific embodiments disclosed may be readily utilized as a basis for modifying or designing other structures or processes within the scope present invention. It should also be realized by those skilled in the art that such equivalent constructions do not depart from the spirit and scope of the invention as set forth in the appended claims.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Before describing several exemplary embodiments of the invention, it is to be understood that the invention is not limited to the details of construction or process steps set forth in the following description. The invention is capable of other embodiments and of being practiced or being carried out in various ways.

Figure 1:
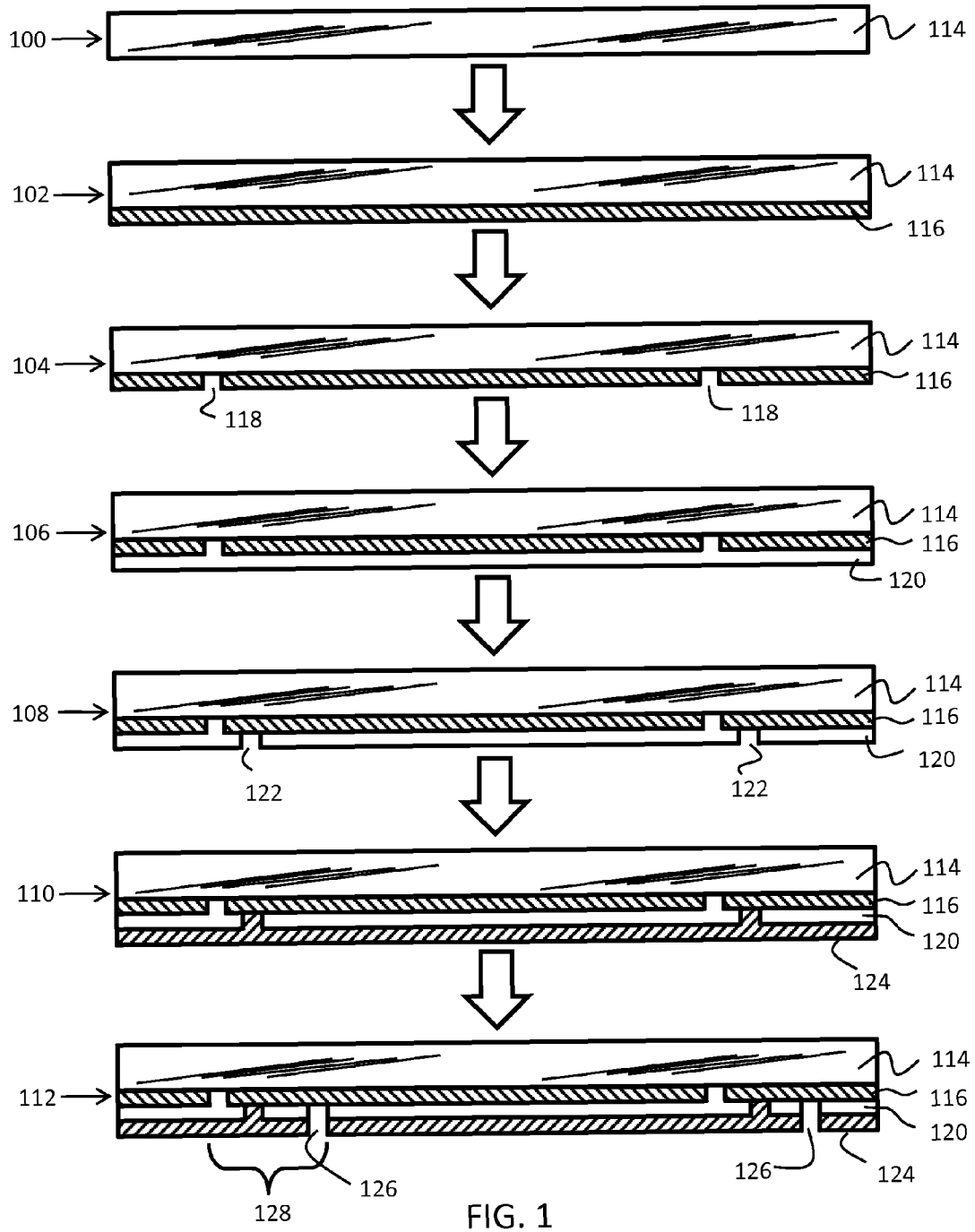
FIG. 1 shows steps for making photovoltaic cells using a laser scribing technique according to the prior art.
Figure 2:
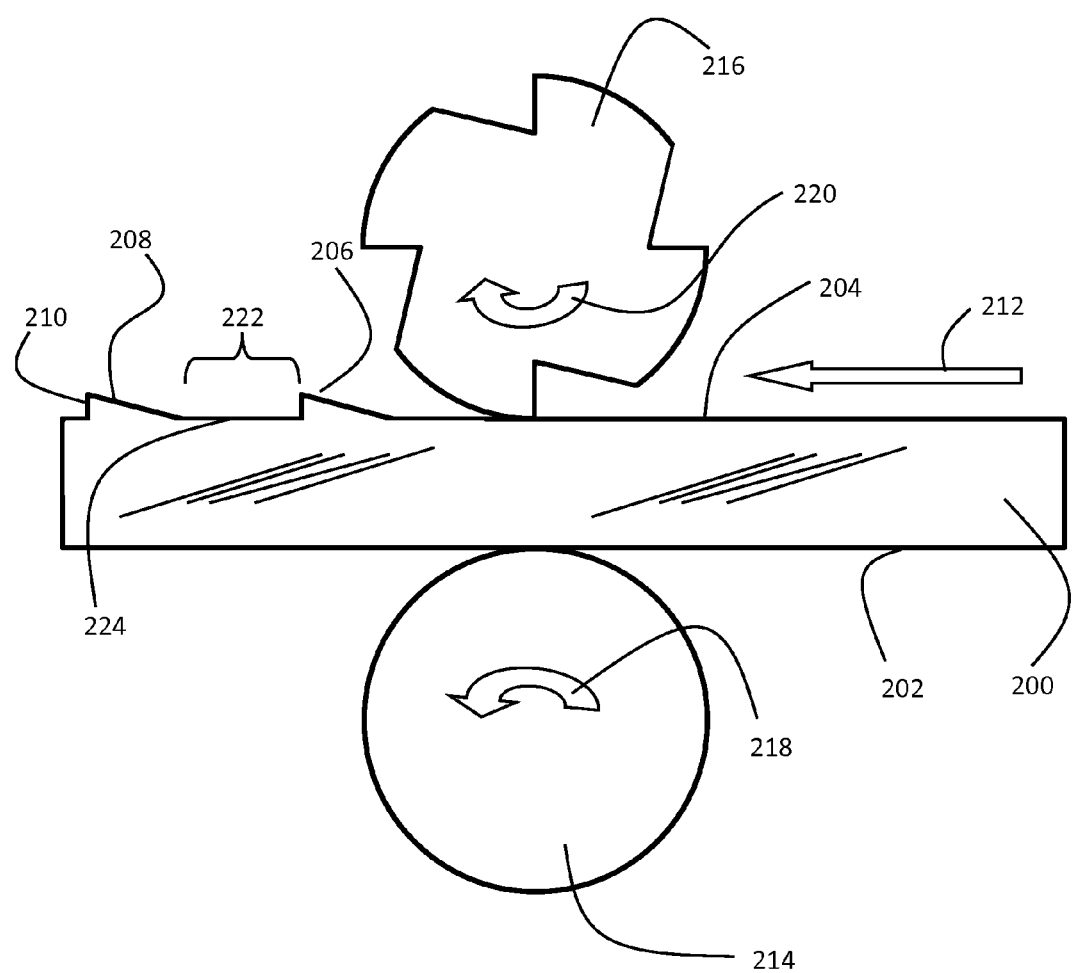
FIG. 2 shows a superstrate being patterned with spaced ramps by a rotogravure-type process in accordance with one embodiment of the invention.

One or more embodiments of the invention are directed to photovoltaic cells and methods of making photovoltaic cells. With reference to FIG. 2, a superstrate 200 is provided which has a front side 202 and a back side 204. A series of spaced ramps 206 are provided on the back side 204 of the superstrate 200. The spaced ramps 206 include ramped surfaces 208 and vertical faces 210 which are substantially perpendicular to the back side 204 of the superstrate 200. The spaced ramps 206 extend through any material layers applied to the back side 204 of the superstrate 200. The spaced ramps 206 extend outwardly from the surface of the back side 204 of the substrate 200 to a height of less than about 10 μm. In detailed aspects, the spaced ramps 206 extend from the superstrate 200 backside 204 to a height of about 5 μm.

The spaced ramps 206 can be formed by any suitable technique. Non-limiting examples of suitable techniques include intaglio, rotogravure, etching, engraving, relief printing and lithography. FIG. 2 shows a rotogravure type process where the superstrate 200, moving from right to left 212, passes between a flat roller 214 and a patterned roller 216. The flat roller 214 is shown rotating in a counter-clockwise direction 218 and the patterned roller 216 rotates in a clockwise direction 220 causing the superstrate 200 to move in the desired direction 212. While the process shown in FIG. 2 has the superstrate moving from right to left, this should not be interpreted as a limitation on the direction of superstrate movement. In one or more embodiments, the spaced ramps may be formed in the superstrate during formation of the superstrate when the glass or plastic sheet material is in a softened state, for example, while the glass or plastic sheet is being formed during a sheet formation operation such as drawing the sheet from a furnace or lehr. Alternatively, a flat glass or plastic sheet may be heated to soften at least the surface so that the spaced ramps can be formed on the sheet. It will be appreciated that for certain materials and processes such as etching, heating may not be required to form the ramps.

The spacing 222 between the spaced ramps 206 can be changed according to the desired size of the resulting solar cells. The spacing 222 is generally less than about 20 mm. Detailed aspects of the invention have the spacing 222 between the spaced ramps 206 of less than about 10 mm. More detailed aspects have the spacing 222 between about 5 and about 10 mm. Other detailed aspects have no spacing 222 between the spaced ramps 206. Where there is a space between the ramps 206, the space 222 may be a substantially flat region 224 on the superstrate 200.

The superstrate 200 can be any suitable material, for example, glass or plastic, and can be any thickness as desired by the intended application. Detailed aspects of the invention include a superstrate which is less than about 5 mm thick. According to other detailed aspects, the superstrate is about 3 mm thick.

Figure 3:
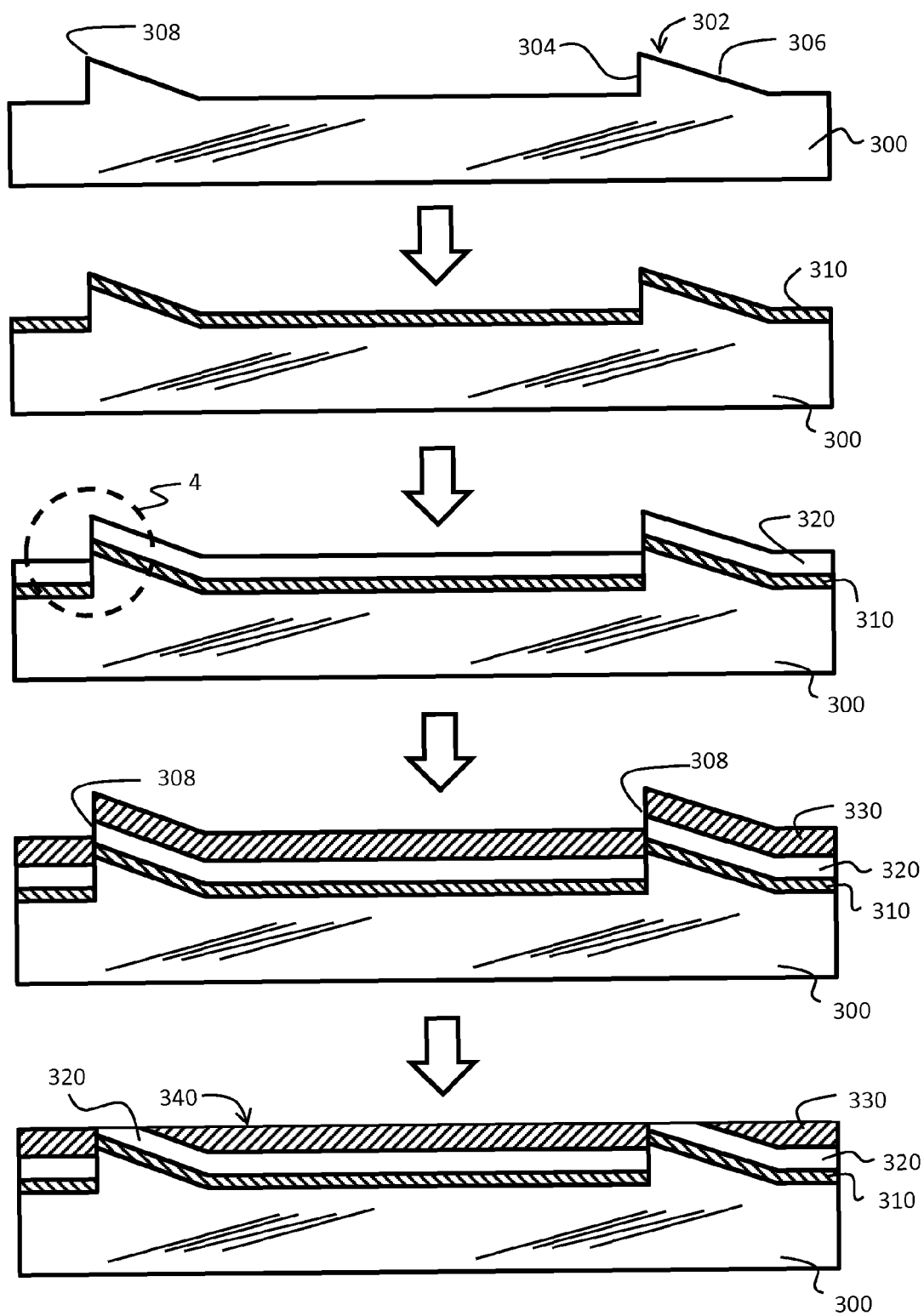
FIG. 3 shows steps for making photovoltaic cells using a superstrate having spaced ramps according to an embodiment of the invention.

FIG. 3 shows steps for preparing a photovoltaic cell according to one or more embodiments of the invention. A superstrate 300 is prepared having spaced ramps 302 with vertical faces 304, as previously described. A transparent conductive oxide (TCO) layer 310 is deposited onto the back side of the superstrate 300. Suitable TCOs are known to those skilled in the art. Non-limiting examples of transparent conductive oxides include aluminum-doped zinc oxide (AZO), indium tin oxide (ITO), indium molybdenum oxide (IMO), indium zinc oxide (IZO) and tantalum oxide. The TCO layer 310 is deposited in a manner such that substantially none of the TCO coats the vertical faces 304 of the spaced ramps 302. The spaced ramps 302 on the superstrate 300 extend through the TCO layer 310.

The TCO layer 310 can be deposited by any suitable means, as would be known to those skilled in the art. Detailed aspects of the invention have the TCO layer 310 deposited by physical vapor deposition. In other aspects, the TCO layer 310 is deposited on an angle toward the ramped surfaces 306 of the spaced ramps 302. By depositing the TCO on an angle, the vertical faces 304 of the spaced ramps 302 are partially shielded, resulting in a decreased likelihood that the TCO will coat the vertical faces 304.

According to some detailed aspects, the TCO layer 310 is up to about 500 nm thick. In other detailed aspects, the TCO layer 310 is about 300 nm thick.

In some detailed embodiments, laser ablation, or other suitable techniques, are used to clean the vertical faces 304 of the spaced ramps 302 after the TCO layer 310 has been deposited. The laser ablation cleaning may be done by directing the laser at the TCO coated superstrate 300 on a grazing angle so that the laser hits substantially only the vertical faces 304 of the spaced ramps 306.

Figure 4:
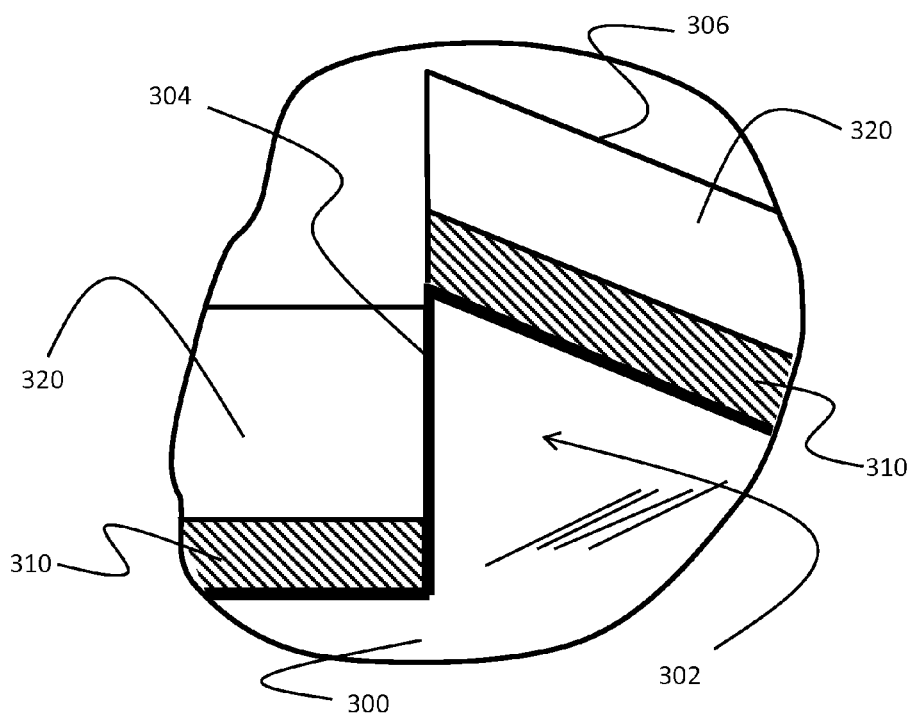
FIG. 4 shows an enlarged view of the top of the spaced ramps, including a transparent conductive oxide layer and a silicon layer.

After depositing the TCO layer 310, a silicon layer 320 is deposited on the transparent conductive oxide layer 310. The silicon layer 320 is deposited between the spaced ramps 302 in a manner such that the silicon layer 320 does not contact the transparent conductive oxide layer 310 on top on the ramped surfaces 306. For instance, the silicon layer 320 does not extend substantially above the peak 308 of the vertical face 304 of the spaced ramps 302. The thickness of the silicon layer 320 is slightly smaller than the height of the individual spaced ramps 302, which is typically about 2 to 3 µm. FIG. 4 shows an expanded view of the top region of one of the spaced ramps 302 with the TCO layer 310 and silicon layer 320 deposited thereon. The spaced ramps 302 on the superstrate 300 extend through the TCO layer 310 and the silicon layer 320. The silicon layer 320 can be deposited by any suitable methods. Detailed aspects of the invention have the silicon layer 320 deposited by chemical vapor deposition.

After deposition of the silicon layer 320, a metal layer 330 is deposited on the silicon layer 320. The spaced ramps 302 of the superstrate 300 extend through the TCO layer 310, the silicon layer 320 and the metal layer 330, resulting in a plurality of peaks 308 projecting through the metal layer 330. The metal layer of some aspects is less than about 2 µm thick. In other detailed aspects, the metal layer is less than about 1 µm thick. Suitable metals for use with photovoltaic cells are known to those skilled in the art. Non-limiting examples include aluminum, molybdenum and combinations thereof.

After deposition of the metal layer 330, at least a portion of the peaks 308 extending from the superstrate 300 through the TCO layer 310, the silicon layer 320 and the metal layer 330 are removed as shown in the last step of FIG. 3. Removal of these protruding peaks 308 results in a substantially flat back surface 340 with portions of the silicon layer 320 being exposed. Methods and techniques for removal of the protruding peaks are known to those skilled in the art. Suitable methods include, but are not limited to, buffing, grinding and cutting.

Figure 5:
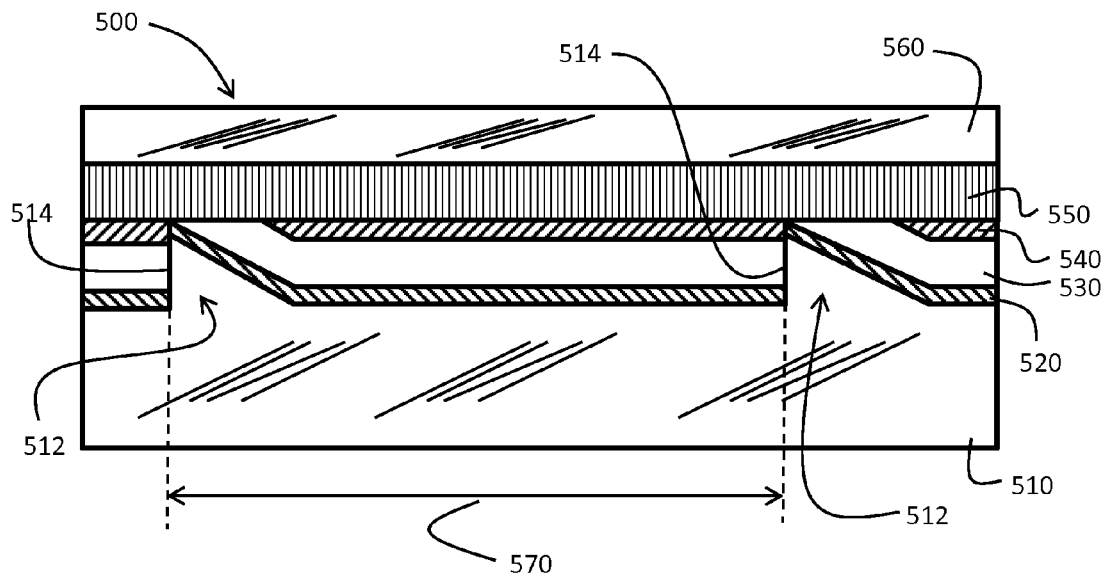
FIG. 5 shows a photovoltaic cell prepared using a patterned superstrate according to one or more embodiments of the invention.

FIG. 5 shows a photovoltaic cell 500 made according to one or more embodiments of the described methods. The photovoltaic cell 500 comprises a superstrate 510 having spaced ramps 512 thereon. The photovoltaic cell 500 is not drawn to scale, the height of the spaced ramps 512 being exaggerated for illustrative purposes. A transparent conductive oxide layer 520 is deposited on the superstrate 510. A silicon layer 530 is deposited on the TCO layer 520, and a metal layer 540 is deposited on the silicon layer 530. The back side of the metal layer 540 is shown after it has been smoothed. A polymer lamination layer 550 may be applied followed by a layer of glass 560, or other suitable material.

The resultant photovoltaic cell 500 is a collection of a plurality of individual photovoltaic cells 570 attached in series. The individual photovoltaic cells 570 extend from the vertical face 514 of one spaced ramp 512 to the vertical face 514 of the adjacent spaced ramp 512. The individual photovoltaic cells 570 are connected to the adjacent cells by a series connection. That is, the TCO layer 520 of one cell 570 connects to the metal layer 540 of the adjacent cell 570.

In the conventional process, what may be referred to as a "dead zone" results between the P1 and P3 laser scribed gaps between individual photovoltaic cells. These dead zones are typically on the order of 100 to 500 µm. The dead zone resulting from the methods and photovoltaic cells described herein is smaller than about 100 microns. The dead zone of specific aspects is less than about 75 µm. The dead zone or other specific aspects is less than about 50 µm. This decrease in the size of the dead zone may result in significantly less waste in the resultant photovoltaic cells.

Reference throughout this specification to "one embodiment," "certain embodiments," "one or more embodiments," "an embodiment," "one aspect," "certain aspects," "one or more embodiments" and "an aspect" means that a particular feature, structure, material, or characteristic described in connection with the embodiment is included in at least one embodiment of the invention. Thus, the appearances of the phrases such as "in one or more embodiments," "in certain embodiments," "in one embodiment," "in an embodiment," "according to one or more aspects," "in an aspect," etc., in various places throughout this specification are not necessarily referring to the same embodiment or aspect of the invention. Furthermore, the particular features, structures, materials, or characteristics may be combined in any suitable manner in one or more embodiments or aspects. The order of description of the above method should not be considered limiting, and methods may use the described operations out of order or with omissions or additions.

It is to be understood that the above description is intended to be illustrative, and not restrictive. Many other embodiments will be apparent to those of ordinary skill in the art upon reviewing the above description. The scope of the invention should, therefore, be determined with reference to the appended claims, along with the full scope of equivalents to which such claims are entitled.

The invention claimed is:

1. A photovoltaic cell comprising:
a superstrate having a front side and a back side, the back side having a plurality of spaced ramps including ramped surfaces and vertical faces which are substantially perpendicular to the back side of the superstrate;
a transparent conductive oxide layer on the back side of the superstrate;
an amorphous silicon layer overlying the transparent conductive oxide layer, wherein the amorphous silicon layer does not extend above the vertical faces of the spaced ramps; and
a metal layer overlying the amorphous silicon layer, the metal layer having a front side facing the amorphous silicon layer and a back side,
wherein the spaced ramps extend from the superstrate through the transparent conductive oxide layer and the amorphous silicon layer and the metal layer is smoothed resulting in a substantially flat back surface exposing portions of the amorphous silicon layer.

2. The photovoltaic cell of claim 1, further comprising a polymer laminate layer on the metal layer and glass on the polymer laminate layer.

3. The photovoltaic cell of claim 1, wherein separation between the spaced ramps is in the range of about 5 mm to about 10 mm.

4. The photovoltaic cell of claim 1, wherein the spaced ramps extend outwardly from the back side of the superstrate up to a height of about 5 microns.

5. The photovoltaic cell of claim 1, wherein the superstrate is about 3 mm thick.

6. The photovoltaic cell of claim 1, wherein the superstrate is glass.

7. The photovoltaic cell of claim 1, wherein the superstrate is plastic.

8. The photovoltaic cell of claim 1, wherein the metal layer is selected from the group consisting of aluminum, molybdenum and combinations thereof.

9. The photovoltaic cell of claim 1, having a dead zone smaller than about 100 microns.

10. A photovoltaic cell comprising:
a superstrate having a front side and a back side, the back side having a plurality of spaced ramps including ramped surfaces and vertical faces which are substantially perpendicular to the back side of the superstrate;
a transparent conductive oxide layer on the back side of the superstrate with the spaced ramps extending through the transparent conductive oxide layer;

a amorphous silicon layer overlying the transparent conductive oxide layer with the spaced ramps extending through the amorphous silicon layer; and a metal layer overlying the amorphous silicon layer with the spaced ramps extending through the metal layer, the metal layer is smoothed to form a substantially flat back surface and expose portions of the amorphous silicon layer.

\* \* \* \* \*